(12) United States Patent
Castracane et al.

(10) Patent No.: US 9,812,591 B2
(45) Date of Patent: Nov. 7, 2017

(54) SELF-BALANCING POSITION SENSITIVE DETECTOR

(71) Applicant: THE RESEARCH FOUNDATION FOR THE STATE UNIVERSITY OF NEW YORK, Albany, NY (US)

(72) Inventors: James Castracane, Albany, NY (US); Natalya Tokranova, Cohoes, NY (US); Leigh Lydecker, Wallkill, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 15/501,961

(22) PCT Filed: Jun. 10, 2016

(86) PCT No.: PCT/US2016/036894
§ 371 (c)(1),
(2) Date: Feb. 6, 2017

(87) PCT Pub. No.: WO2016/209642
PCT Pub. Date: Dec. 29, 2016

(65) Prior Publication Data
US 2017/0256659 A1   Sep. 7, 2017

Related U.S. Application Data

(60) Provisional application No. 62/182,713, filed on Jun. 22, 2015.

(51) Int. Cl.
*H01L 31/00* (2006.01)
*H01L 31/02* (2006.01)
(Continued)

(52) U.S. Cl.
CPC .......... *H01L 31/02024* (2013.01); *G01J 1/44* (2013.01); *H01L 31/02005* (2013.01); *H01L 31/147* (2013.01); *G01J 2001/446* (2013.01)

(58) Field of Classification Search
CPC ............... H01L 31/02; H01L 31/02002; H01L 31/02024
(Continued)

(56) References Cited

U.S. PATENT DOCUMENTS 8,384,879 B2 *   2/2013   Vogelsang .......... G03F 7/70775
                                                      355/53
2002/0020846 A1   2/2002   Pi et al.
(Continued)

FOREIGN PATENT DOCUMENTS

EP           2009696 A1     12/2008

OTHER PUBLICATIONS

International Search Report and Written Opinion issued in PCT/US2016/036894, dated Aug. 24, 2016.
(Continued)

*Primary Examiner* — Kevin Pyo
(74) *Attorney, Agent, or Firm* — Heslin Rothenberg Farley & Mesiti P.C.

(57) ABSTRACT

A self-balancing optical position sensitive detector includes a pair of spaced apart, parallel, longitudinally extending doped regions on a first surface on a front side of a substrate 16 of opposite doping type with contact pads on the front side at respective ends of a first doped region of the pair. A voltage source applies a potential difference between the contact pads of the first doped region. On the front side, a contact pad of the second doped region of the pair provides an analog output signal representative of a longitudinal position of a center of gravity of an incident light pattern along the doped regions without external circuitry process-
(Continued)

ing the output signal to obtain a readout of the longitudinal position. A resistive line may directly overly, abut and be in contact with at least a portion of the first doped region. A conductive line may directly overly, abut and be in contact with at least a portion of the second doped region. No backside contact or processing of the substrate is required or employed.

9 Claims, 9 Drawing Sheets

(51) Int. Cl.
    *H01L 31/147*     (2006.01)
    *G01J 1/44*     (2006.01)

(58) Field of Classification Search
    USPC .............. 250/206.1, 214.1; 257/66, 431, 448
    See application file for complete search history.

(56) References Cited

U.S. PATENT DOCUMENTS

| 2009/0085036 A1* | 4/2009 | Chen ................... H01L 31/1136 257/66 |
|---|---|---|
| 2010/0271711 A1 | 10/2010 | Yoshida et al. |

OTHER PUBLICATIONS

Medrano, F. Antonio, "Optical Position Sensors with Applications in Servo Feedback Subwoofer Control," <https://www.mat.ucsb.edu/Masters/medrano_MASTERS2009.pdf> (2009).
Mäkynen et al., "Digital optical position-sensitive detector (PSD)." Instrumentation and Measurement Technology Conference, Proceedings of the 21st EEEI, 3:2358-2360 (2004).
Wallmark, J.T. " New Semiconductor Photocell Using Lateral Photoeffect." Proc. IRE., 45:474-483 (1957).
Zeng et al., "A two-beam laser triangulation for measuring the position of a moving object." Opt. Lasers Eng. 1999, 31, 445-453.
Sharp Electronics, "GP2D12/GP2D15-Distance Measuring Sensors." Product Data Sheet U970501, May 1997.
Makynen et al., "Digital Optical Position-Senstive Detector (PSD)." in Proceedings of the 21st IEEE Instrumentation and Measurement Technology Conference (IMTC 04), Como, Italy, May 18-20, 2004; vol. 3, pp. 2358-2360.
Chowdhury et al., "CMOS 1D and 2D N-Well Tetra-Lateral Position Sensitive Detectors." In Proceedings of the 1998 IEEE International Symposium on Circuits and Systems (ISCAS '98), Monterey, CA, USA, 31 May 31-Jun. 3, 1998; vol. 6, pp. VI-606-VI-609.
Makynen et al., "High accuracy CMOS position-sensitive photodetector (PSD)." Electron. Lett. 1997, 33, 128-130.
Lucovsky, Gerald, "Photoeffects in Nonuniformly Irradiated p-n Junctions." J. Appl. Phys. 1960, 31, 1088-1095.
Woltring, Herman J., "Single- and dual-axis lateral photodetectors of rectangular shape." IEEE Trans. Electron. Devices 1975, 22, 581-590.
Petersson et al., "Position sensitive light detectors with high linearity." IEEE J. Solid-State Circuits 1978, 13, 392-399.
Martins et al., "Lateral photoeffect in large area one-dimensional thin-film position-sensitive detectors based in a-Si: H P-I-N devices." Rev. Sci. Instrum. 1995, 66, 2927-2934.
Martins et al., "Nanostructured silicon and its application to solar cells, position sensors and thin film transistors." Philos. Mag. 2009, 89, 2699-2721.
Andersson, Henrik, "Position Sensitive Detectors—Device Technology and Applications in Spectroscopy Applications in Spectroscopy." Ph.D Thesis, Mid Sweden University, Sundsvall, Sweden, 2008.
Kramer et al., "Industrial CMOS technology for the integration metrology systems (photo-ASICs)." Sens. Actuators A Phys. 1992, 34, 21-30.
Spieler, Helmuth, "Introduction to Radiation Detectors and Electronics." Available online: http://www-physics.lbl.gov/~spieler/physics_198_notes/PDF/VI-PSD.pdf (accessed on Jul. 10, 2015).
Radeka et al., "Charge Dividing Mechanism on Resistive Electrode in Position-Sensitive Detectors." IEEE Trans. Nuclear Sci. 1979, 26, 225-238.
Hamamatsu Photonics, Chapter 02 Si Photodiodes. In Hamamatsu Opto-Semiconductor Handbook; Hamamatsu Photonics: Hamamatsu, Japan, 2014.
De Bakker, Michiel, "The PSD Chip High Speed Acquisition of Range Images." Ph.D Thesis, Delft University of Technology, Delft, The Netherlands, 2000.
Hamamatsu Photonics, Si Pin Photodiodes S1223 Series Kpin1050E02 Datasheet. Feb. 2013.

* cited by examiner

SELF-BALANCING POSITION SENSITIVE DETECTOR

CROSS REFERENCE TO RELATED APPLICATIONS

This application is the National Phase filing under 35 U.S.C. §371 of International Application No. PCT/US2016/036894, filed on Jun. 10, 2016, and published on Dec. 29, 2016, as WO/2016/209642 A1, and claims priority to U.S. Provisional Patent Application No. 62/182,713, filed on Jun. 22, 2015. The contents of each of the prior applications are hereby incorporated by reference herein in their entirety.

BACKGROUND ART

The invention relates to position sensitive detectors, and more particularly, to one-dimensional optical position sensitive detectors.

One-dimensional position sensitive detectors have a wide range of applications in current electronics. They convert the position of an object of interest into an electrical signal that can be integrated into the electronic device, allowing for applications that require the monitoring of single-axis mechanical motion.

A linear (or "sliding") potentiometer is often used as a position sensor. In the linear potentiometer, a resistive strip distributes applied potential. A metallic "wiper" contact moves along the resistive element. Potential on the wiper is determined by the position of the wiper contact along the resistive strip. However, constant wear and tear from frequent motion of the slider deteriorates the material over time which may eventually cause sensor failure. For this reason, a non-contact sensor is desirable for many applications.

Optical position sensitive detectors provide a non-contact method of tracking the location of a light spot [1]. Silicon-based versions of such sensors may be fabricated with standard CMOS technology, are inexpensive and provide a real-time, analog signal output corresponding to the position of the light spot.

There are two main classes of optical position sensors, or position sensitive detectors (PSDs). The first type is composed of discrete photo sensor elements that provide position information in the form of a digital output (e.g. CCDs [2] or linear array of discrete photodiodes). The second type is a sensor with a continuous photosensitive surface that provides position data in the form of an analog output (e.g. Lateral effect PSD [3][4][5]).

Lateral effect position sensitive detectors (LEPSDs) may be fabricated using standard CMOS processing techniques [6], and provide an analog output and a relatively low cost, accurate method of sensing position. However, LEPSDs require a backside contact which results in increased packaging costs. If a sensor could have all contacts on one side of the substrate, then the cost of the sensors and their packaging could be reduced by eliminating all backside processing and associated costs. Further, minimization of required readout circuitry is desired. Analog output position sensitive detectors typically require less signal processing circuitry than a digital output position sensor. However, developing a sensor with a direct readout from the sensor itself eliminates the need for any external output signal processing circuitry, which makes use of the device for various applications easier and less expensive. Consideration of these factors led to the development of the self-balancing position sensitive detector of the present invention.

BRIEF SUMMARY OF THE INVENTION

In one aspect, the self-balancing position sensitive detector (SBPSD) of the current invention comprises a pair of spaced apart, parallel, longitudinally extending doped regions on a first surface on a front side of a substrate of opposite doping type, with contact pads on the front side at respective ends of a first doped region of the pair. A potential difference or voltage is applied between the contact pads of the first doped region. This region is referred to hereinafter as the biased line or biased region. On the front side, a contact pad of a second doped region of the pair, referred to hereinafter as a floating line or floating region, provides an analog output signal representative of a longitudinal position of a center of gravity of an incident light pattern along the doped regions, without employing any backside contract on the substrate or external circuitry to process the output signal in order to obtain a readout of the longitudinal position.

In another aspect, the self-balancing optical position sensitive detector of the current invention comprises a pair of spaced apart, parallel, longitudinally extending doped regions on a first surface on a front side of a substrate of opposite doping type, with contact pads on the front side at respective ends of a first doped region of the pair. A resistive line directly overlies, abuts and is in contact with at least a portion of the first doped region and interconnects the contact pads of the first doped region. A voltage source applies a potential difference between the contact pads of the first doped region. On the front side, a contact pad of a second doped region of the pair provides an output signal representative of a longitudinal position of a center of gravity of an incident light pattern along the doped regions.

The resistive line may comprise one of a metal, or a doped area having a same doping type as the first doped region and a higher doping concentration than the first doped region.

The self-balancing optical position sensitive detector may further comprise a conductive line directly overlying and abutting at least a portion of the second doped region The self-balancing optical position sensitive detector may be combined with a light source providing a light pattern incident along the doped regions, and at least one of the light source and the light pattern may be adapted for movement together with, or in association with, or responsive to, a moveable member. The light pattern may comprise a light spot, multiple light spots, or distributed illumination.

Advantageously, the detector provides an analog output signal at the contact pad of the second doped region representative of the longitudinal position of a center of gravity of an incident light pattern along the doped regions without needing or employing external circuitry to process the output signal in order to obtain a readout of the longitudinal position.

In a further aspect, a method is provided for determining the longitudinal position of a light pattern incident on the doped regions of the self-balancing optical position sensitive detector, comprising: applying a potential difference between the contact pads of the first doped region, and measuring the potential at a contact pad of the second doped region, without further processing of the output signal provided from the contact pad of the second doped region, to obtain a readout of the longitudinal position.

In another aspect, a method is provided for fabricating the self-balancing optical position sensitive detector, comprising: employing semiconductor fabrication techniques with no backside processing of the substrate to produce the self-balancing optical position sensitive detector.

The self-balancing position sensitive detectors of the present invention can replace existing linear potentiometers. Non-contact position tracking results in sensor longevity. Integrated circuit fabrication methods result in low production costs.

By eliminating all backside processing and associated costs, and by eliminating the need for external output signal processing circuitry entirely, the self-balancing position sensitive detector of the current invention provides increased simplicity with no external electronics required for output signal processing in order to obtain a readout of the longitudinal position, and extremely low cost, compared to known lateral effect position sensitive detectors.

BRIEF DESCRIPTION OF THE DRAWING FIGURES

FIG. 1A illustrates a top plan view of a first embodiment of the Self-Balancing Position Sensitive Detector (SBPSD) of the present invention.

FIG. 1B presents a side view of the SBPSD of FIG. 1, illustrating the absence of any backside processing.

FIG. 2 presents a plot of photogenerated current versus voltage about an equipotential position for the first embodiment.

Figure 7:
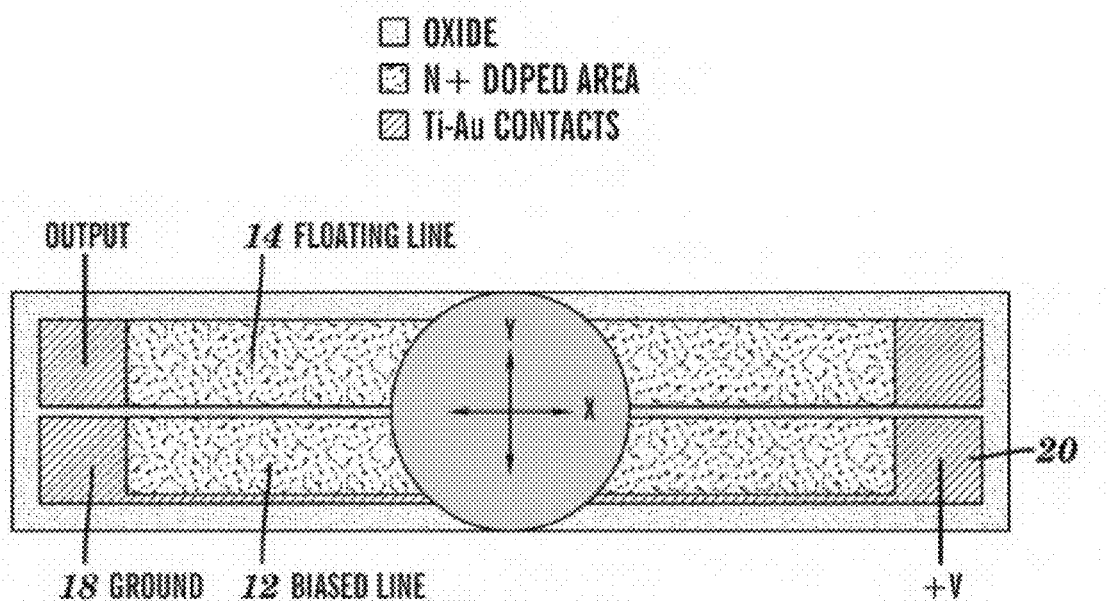

FIG. 7 provides a schematic drawing of light spot positioning.

Figure 8:
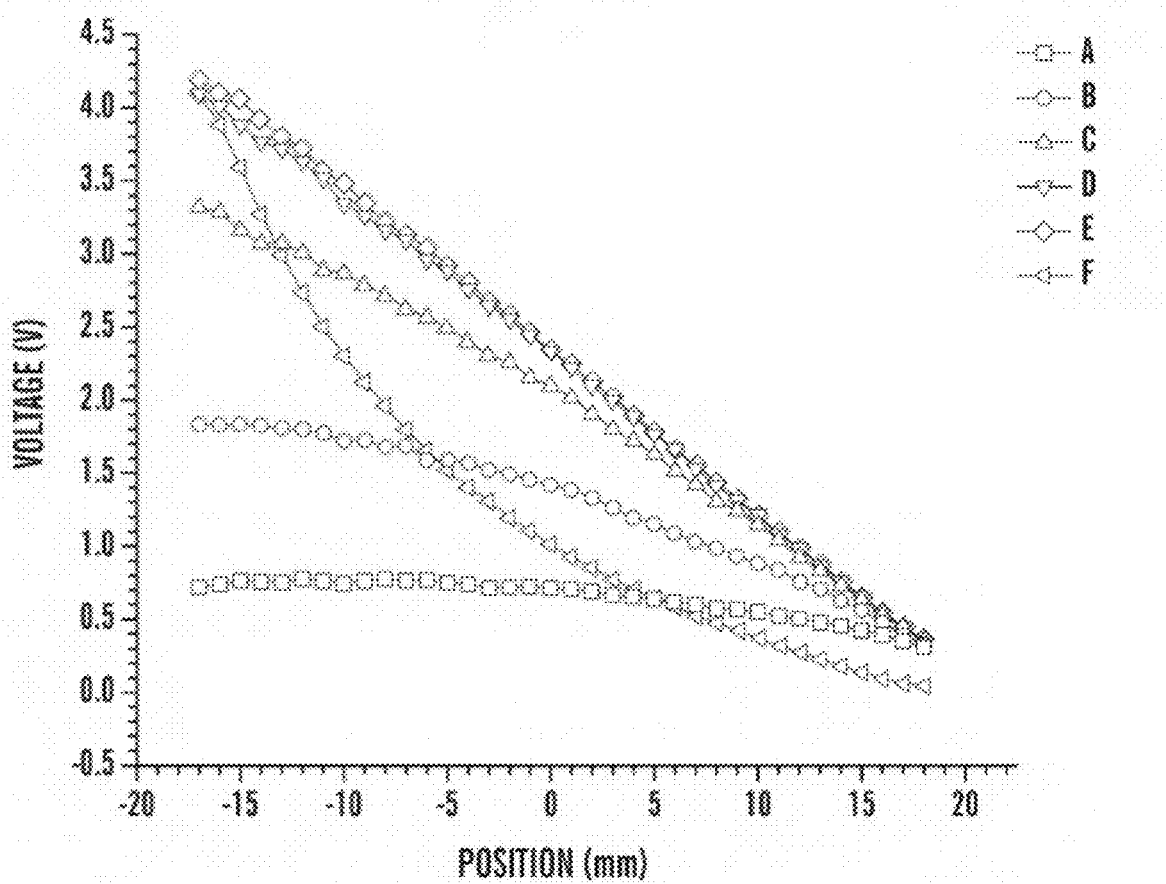

FIG. 8 presents plots of output voltage versus position measurements for various light positions (A=−0.4 mm, B=−0.2 mm, C=0 mm, D=0.2 mm, E=0.4 mm, F=0.4 mm). In positions A-E, the 0-5 V bias was applied to the biased line and the floating potential measured on the floating line; for position F, the 0-5 V bias was applied on the floating line, and the floating potential measured on the biased line.

Figure 9:
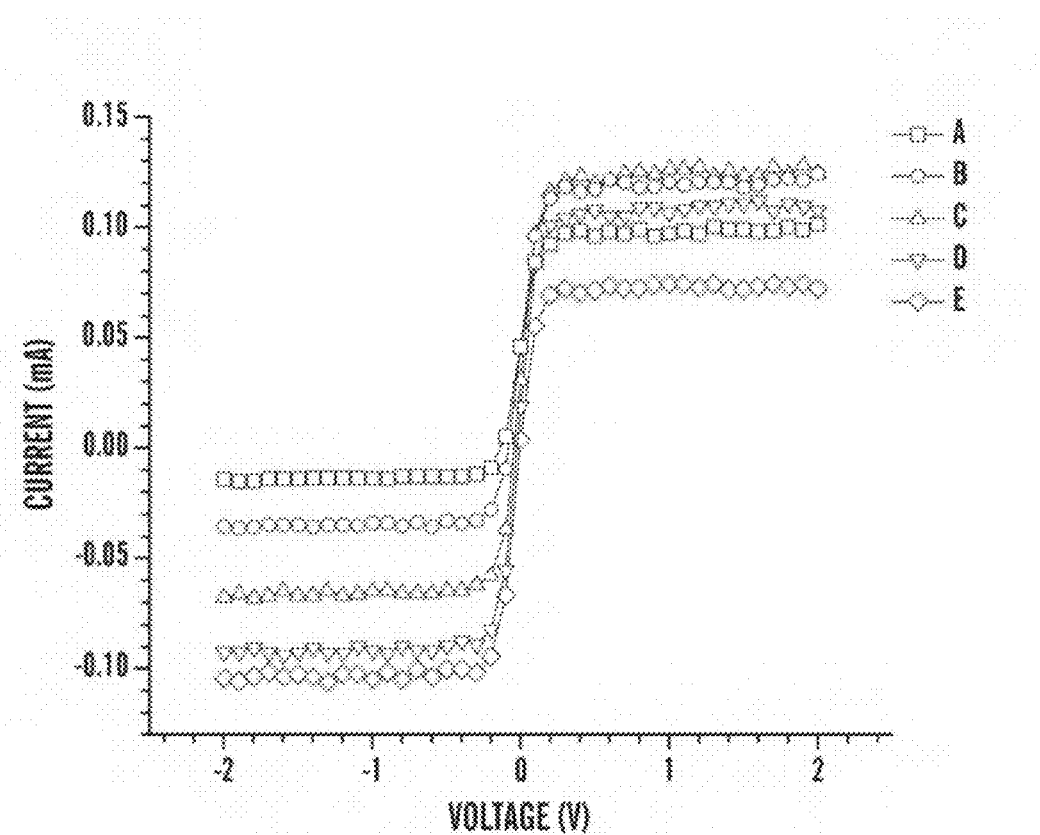

FIG. 9 depicts output voltage versus current measurements for the various light positions.

Figure 10:
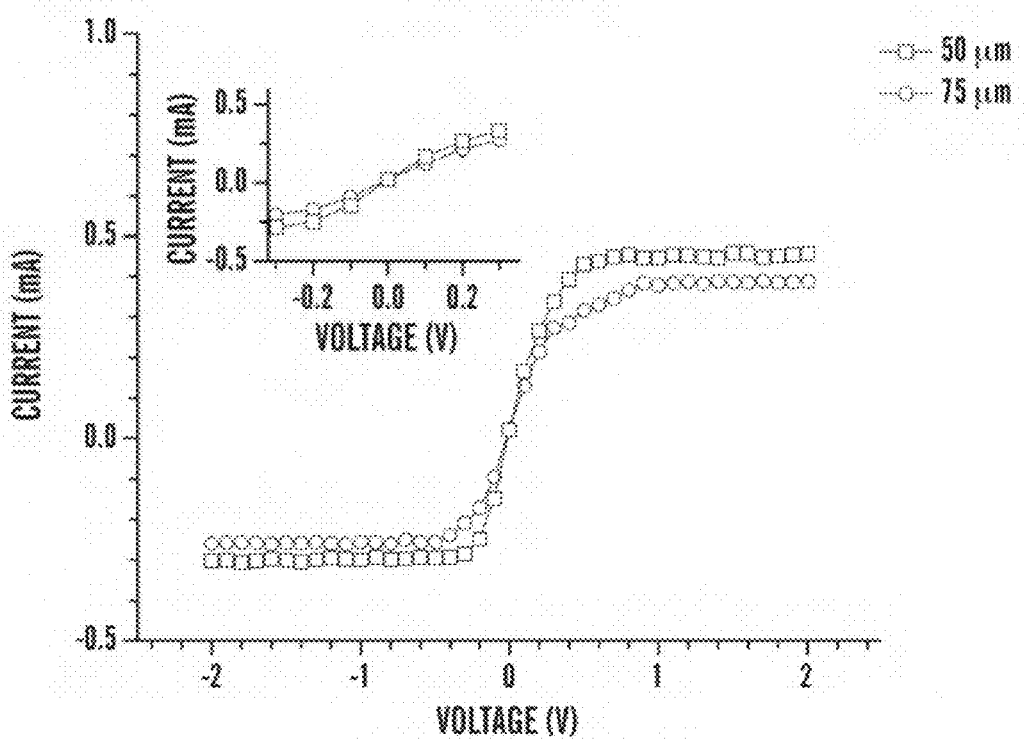

FIG. 10 depicts I-V curves of 37 mm SBPSD with 50 and 75 μm spacing between doped regions. The inset from −0.3 to 0.3 shows the resistance changes when the distance between doped regions varies.

Figure 11:
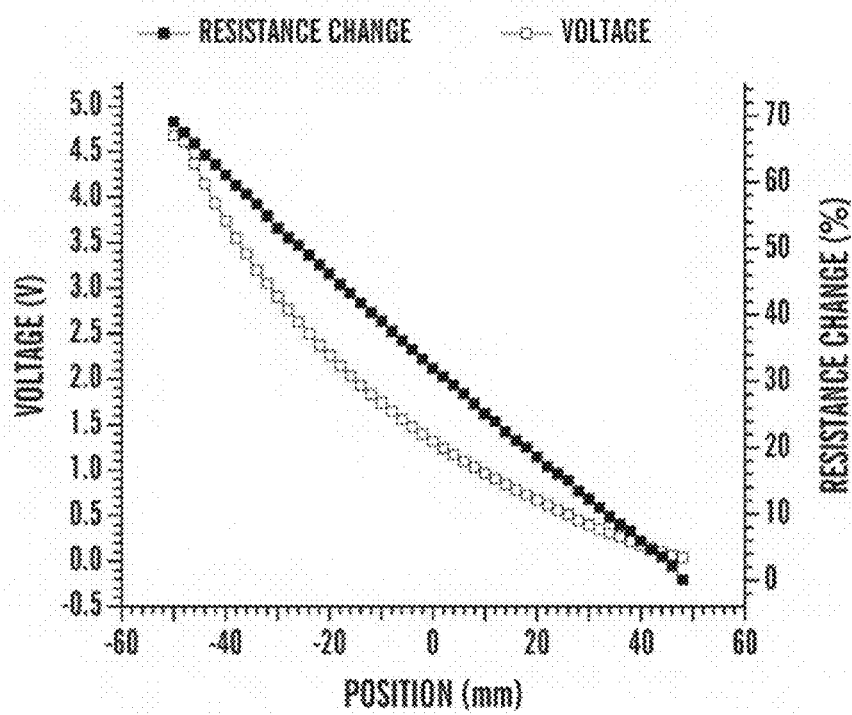

FIG. 11 illustrates a coordinate plot and resistance change for a 0 to 5 V bias applied to a Ti metal line.

Figure 12:
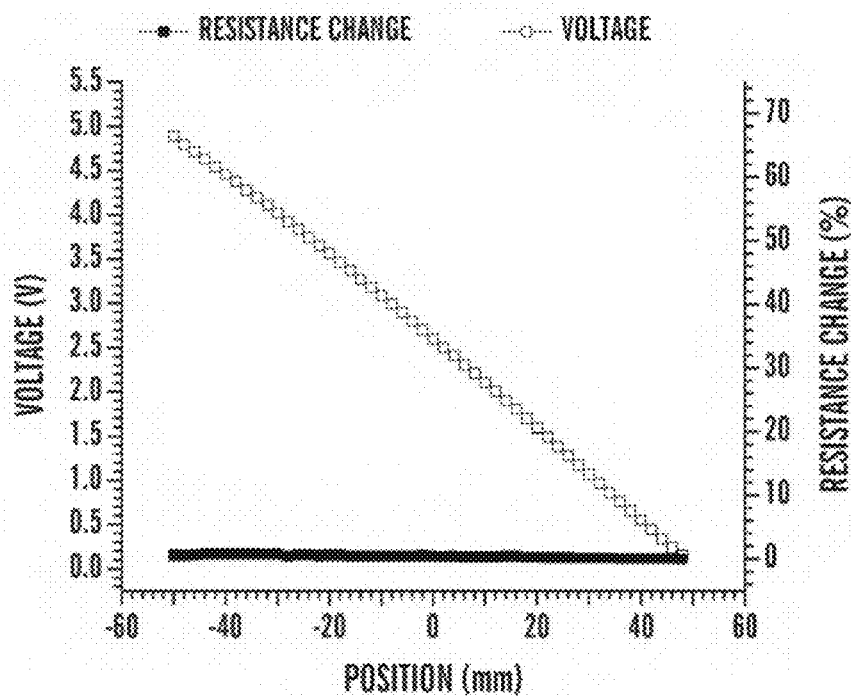
Figure 13A:
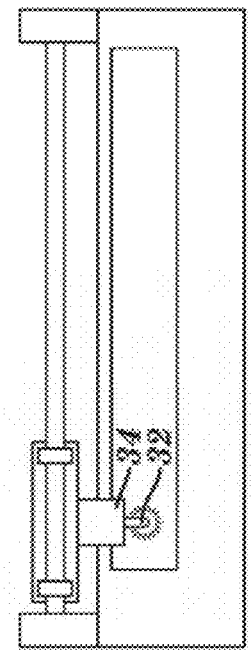
Figure 13A:
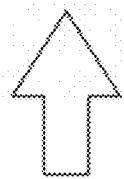
Figure 13A:
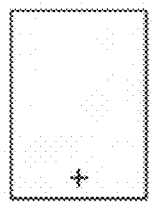
Figure 13B:
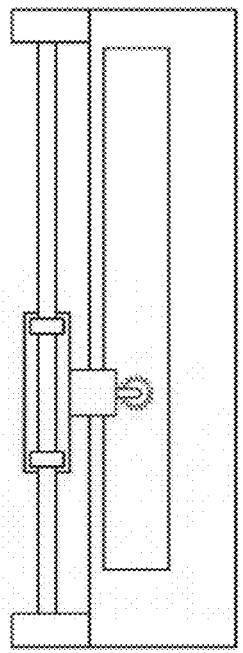
Figure 13B:
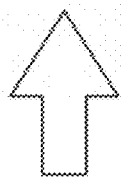
Figure 13B:
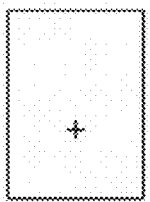
Figure 13C:
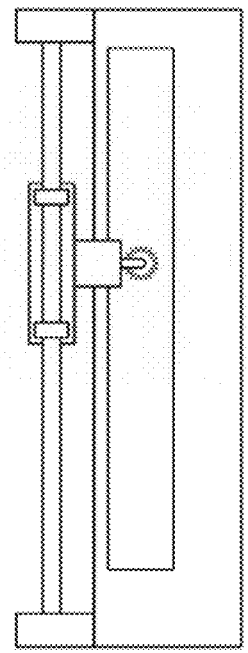
Figure 13C:
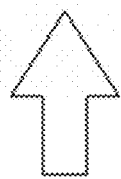
Figure 13C:
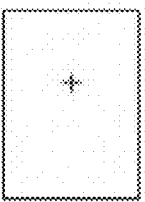
Figure 13D:
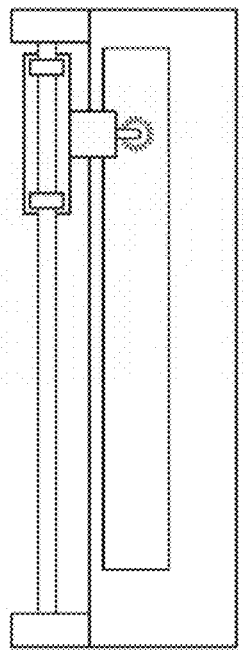
Figure 13D:
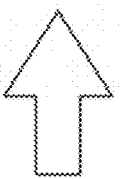
Figure 13D:
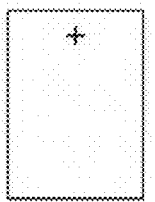

FIG. 12 presents a coordinate plot and resistance change for a 0 to 5 V bias applied to a Ti/Au metal line.

FIGS. 13A-13D depicts computer interfacing of a SBPSD using a built-in game controller configuration calibration settings.

DETAILED DESCRIPTION

Device Construction and Operation

Figure 1A:
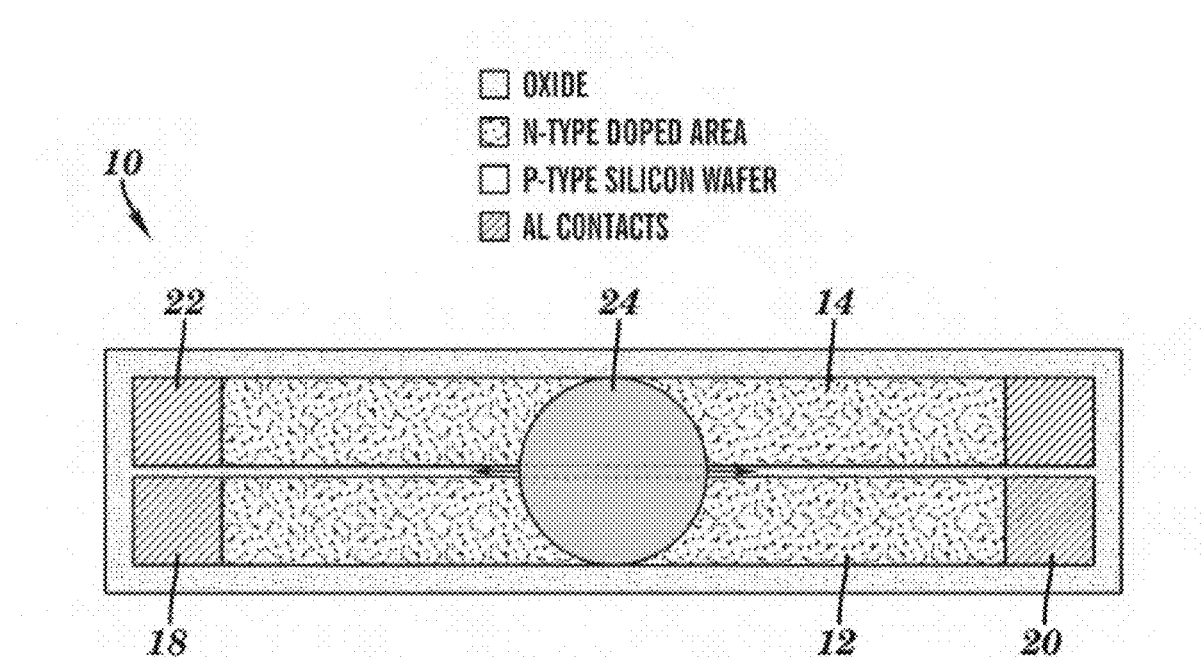
Figure 1B:
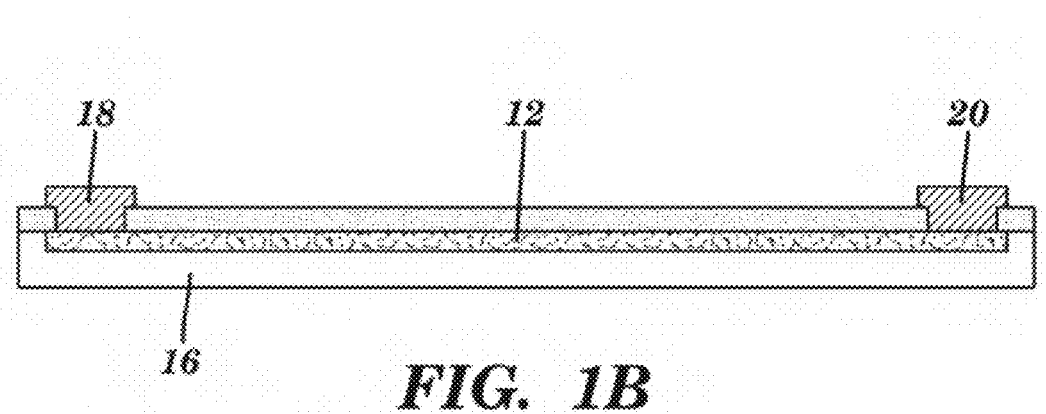
Figure 2:
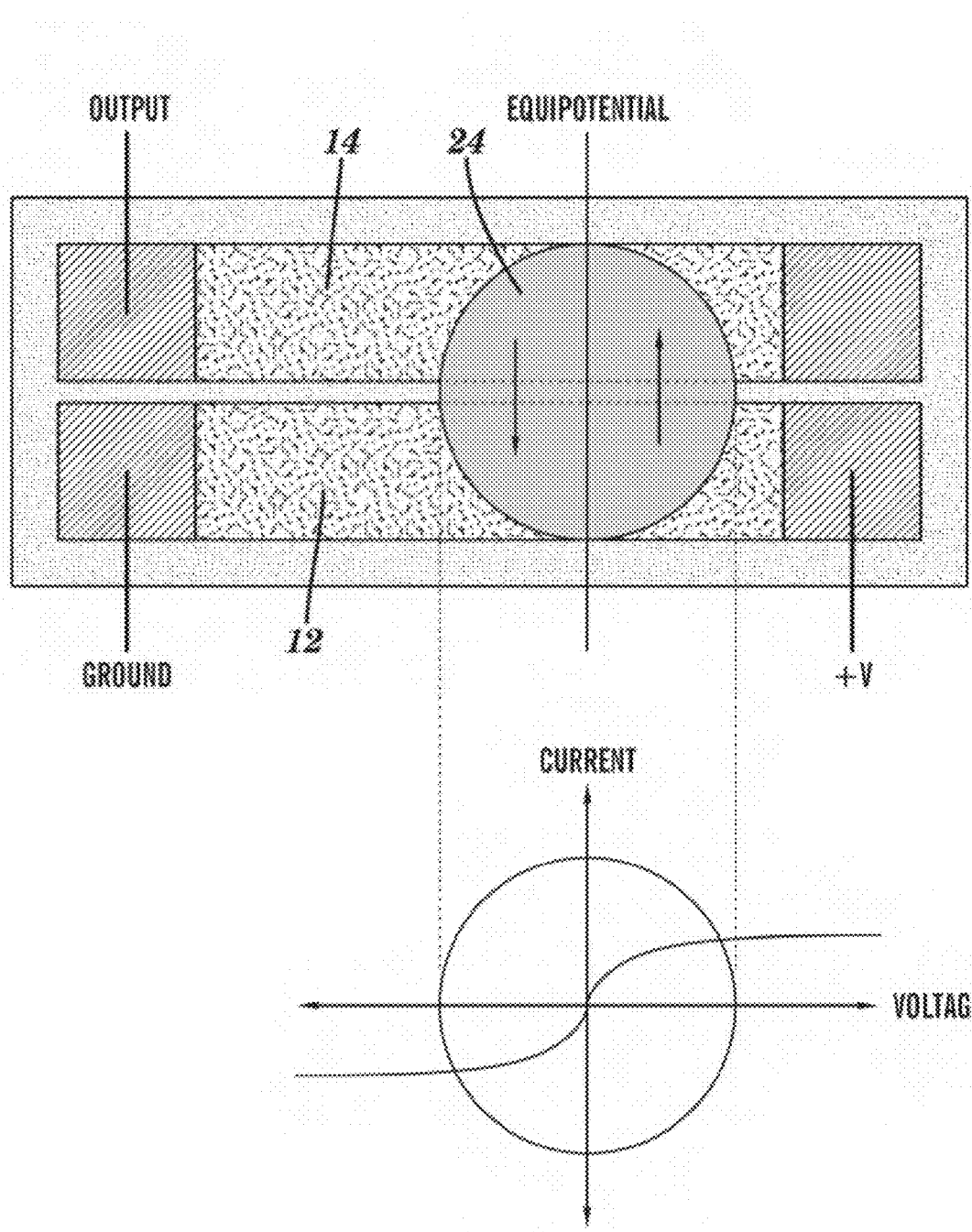

A first embodiment of the Self-Balancing Position Sensitive Detector (SBPSD) 10, is illustrated in FIGS. 1A, 1B and 2, and includes a pair of spaced apart, parallel, longitudinally extending doped regions 12, 14 on a first surface on a front side of a substrate 16 of opposite doping type with contact pads 18, 20 on the front side at respective ends of a first doped region 12 of the pair. A potential difference or voltage V is applied between the contact pads 18, 20 of the first doped region 12. This region 12 is referred to hereinafter as the biased line or biased region. On the front side, a contact pad 22 of a second doped region 14 of the pair, referred to hereinafter as a floating line or floating region, provides an analog output signal representative of a longitudinal position of a center of gravity (also referred to herein as an equipotential position) of an incident light pattern, e.g., a light spot 24, along the doped regions, without needing or employing any backside contact or processing of the substrate 16, or any external circuitry to process the output signal in order to obtain a readout of the longitudinal position.

The two doped regions 12, 14 form a linear back-to-back photodiode pair from the n-p-n junction along the device. Since the photodiodes are connected back-to-back, one of them is reverse biased and the other is forward biased.

When a light pattern, e.g. a light spot 24, is incident on the doped regions, i.e. the pair of back-to-back connected photodiodes, the reverse biased part of the diode generates current. This current travels freely through the forward biased part of the diode, accumulating charge on the floating line and changing its potential. The flow of current between the two doped regions causes the potential on the floating line to equilibrate to the same value as that of the biased line at the center of gravity position of the light spot.

A second embodiment of the Self-Balancing Position Sensitive Detector (SBPSD) 26, which is especially suitable for longer devices, e.g. having a length of 3 cm or greater, is illustrated in FIGS. 3A, 3B, 3C, 4A and 4B, and comprises a pair of spaced apart, parallel, longitudinally extending doped regions 12, 14 on a first surface on a front side of a substrate 16 of the opposite doping type, with a resistive line 28 directly overlying, abutting and in contact with at least a portion of first doped region 12 of the pair and interconnecting contact pads 18, 20 on the front side at the ends of the first doped region 12, and a conductive line 30 directly overlying, abutting and in contact with at least a portion of the second doped region 14 of the pair.

The resistive line 28 may comprise any resistive material including metal, or a doped area (e.g. doped polycrystalline silicon) having a same doping type as the first doped region 12 but higher doping concentration than the first doped region. Materials for the resistive line may be different for different length devices. The resistive line, in effect, provides a resistor in parallel to the resistor of the first doped region, and serves to stabilize the resistivity of the biased line and helps to eliminate the influence of light on the bias distribution across the device during operation.

The conductive line 30 may be comprise any conductive material including metal or a doped area (e.g. doped polycrystalline silicon) having a same doping type as the second doped region 14 but lower doping concentration than the second doped region. The conductive line serves to help linearize the sensor performance by maintaining identical potential along the line. Together, the resistive line 28 and the conductive line 30 increase the linearity of the coordinate characteristic, as more fully described hereinafter.

The one doped region 12 to which voltage V is applied, is again referred to as the distributed biased line while the second doped region 14 on which the final potential is measured is again called the floating line.

In one embodiment, two n-type regions were produced in a p-type substrate. Each region is resistive, based on the doping concentration used. The two regions form a linear back-to-back photodiode pair from the n-p-n junction along the device, resulting in the characteristic I-V curve typical of an n-p-n junction. Because the photodiodes are connected back-to-back, one of them is reverse biased and the other is forward biased. The reverse bias determines the current flowing inside the device.

The floating line is measured with a high input resistance device, e.g. a voltmeter, in order to maintain current flow inside the device [7]. Once illuminated, one of the diodes will be split into a part that is reverse biased on the right side of the illuminated spot while the left side will be forward biased. The second diode will then be forward biased on the right side of the illuminated spot while the left side will be reverse biased. The potential difference across the n-p-n junction determines the state on the diode, i.e., which part of the diode is reverse biased, which part of the diode is forward biased, and the resulting direction of current flow. When a light pattern, e.g., a light spot, is incident on the pair of back-to-back connected photodiodes, the reverse biased part of the diode generates current. This current travels freely through the forward biased part of the diode, accumulating charge on the floating line and thus, changing its potential [8]. The biased line maintains a constant linear potential distribution.

Figure 3A:
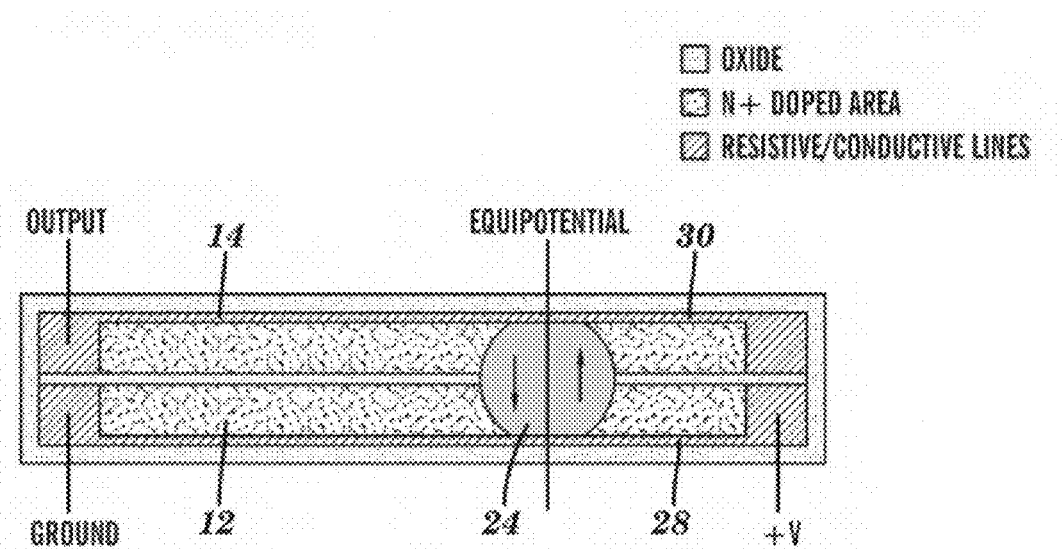
FIG. 3A is a top view illustration of a second embodiment of the SBPSD of the current invention with a resistive line and a conductive line, and depicting direction of current flow under an illuminated light spot at the equipotential position.
Figure 3B:
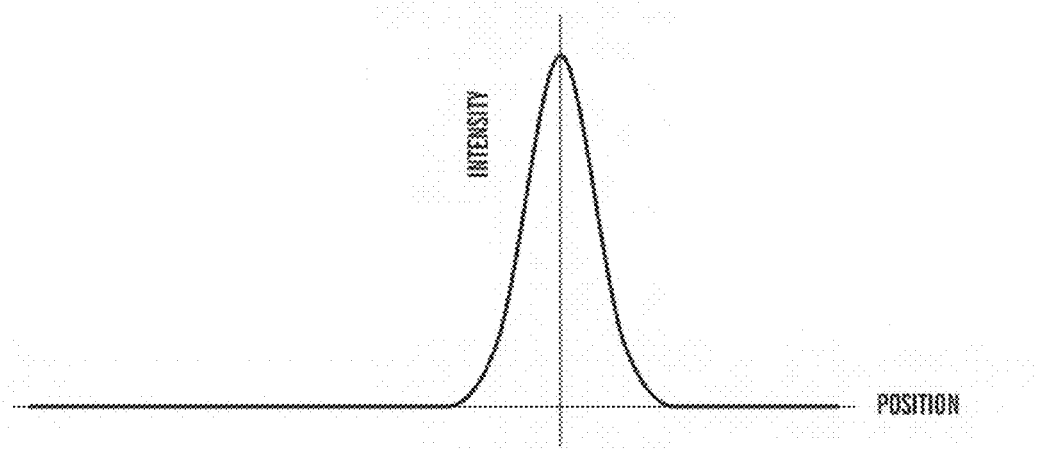
FIG. 3B depicts a spatial distribution of the intensity of the light spot.
Figure 3C:
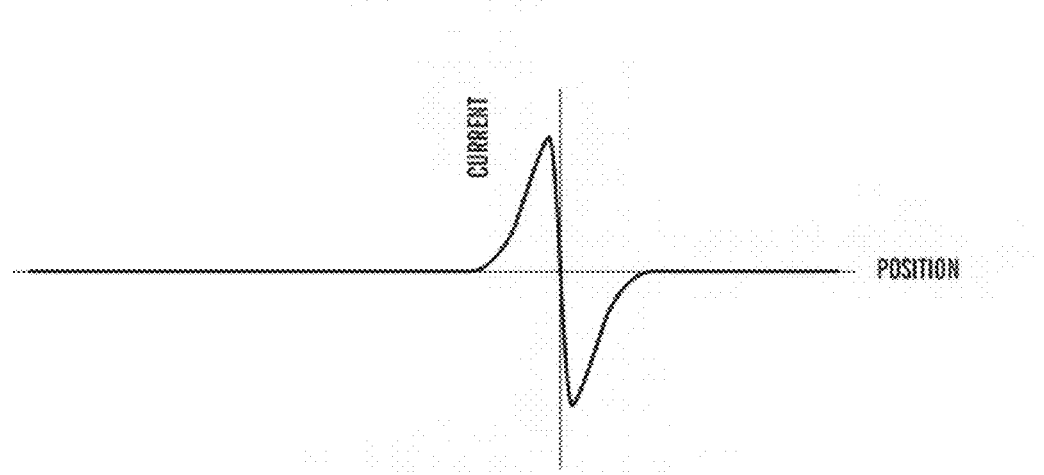
FIG. 3C depicts current produced in the device upon illumination in equilibrated state.
Figure 4A:
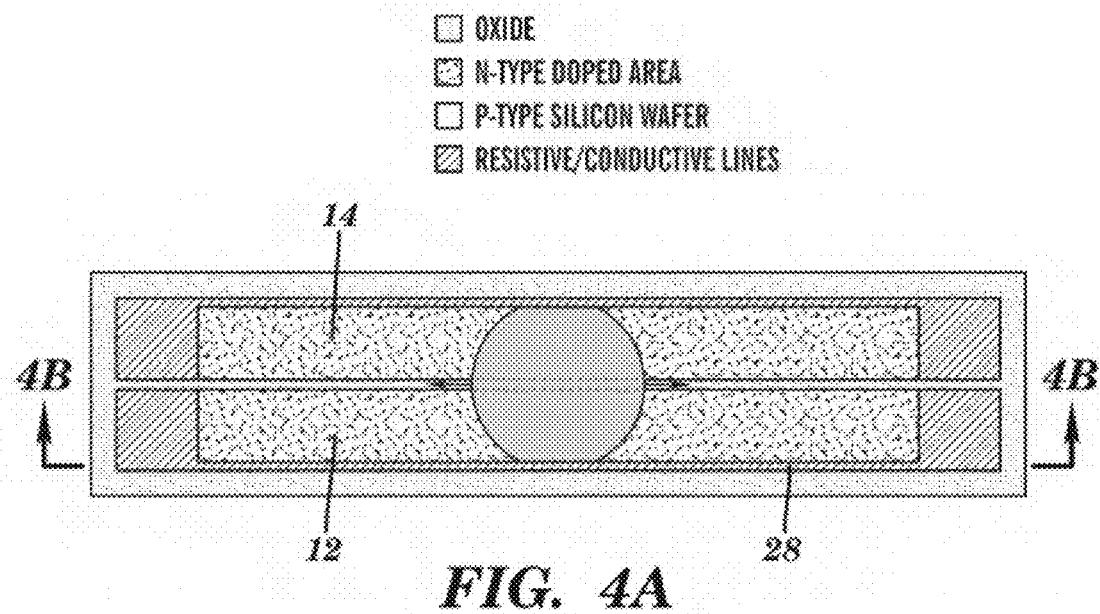
FIG. 4A is another top plan view of the second embodiment.
Figure 4B:
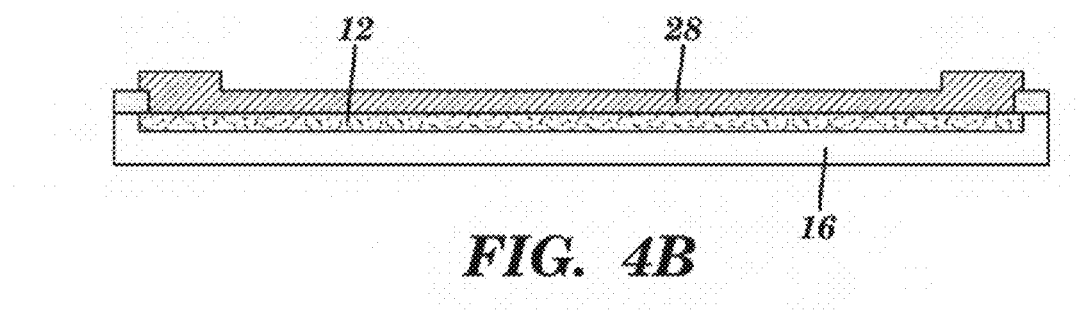
FIG. 4B illustrates a sectional view along lines 4B-4B of the top view of FIG. 4A, and the absence of backside processing of the substrate.

Potential difference between regions at each point across the device determines current direction at each location. The illuminated light pattern, e.g., a light spot 24, creates a flow of current between the regions as shown in FIG. 3A. The generated currents automatically balance their flows around the center of gravity of the light pattern, e.g., a light spot. The center of gravity is a position where the potential values of the two regions are the same, i.e. the equipotential position. The flow of current between the two regions causes the potential on the floating line to equilibrate to the same value as that of the biased line at the center of gravity position of the light pattern, e.g., a light spot. At equilibrium, the currents on both side of the center of the light pattern, e.g., a light spot, are equal.

A critical figure of merit for photodiodes is the responsivity, which is the ratio of the optical generated current to the input power of the light, as shown in the following equation.

$$\mathfrak{R} = \frac{I_{op}}{P_{opt}}$$

The responsivity is given in units of Amps per Watt (A/W). Typical responsivity values of silicon photodiodes at 623 nm is ~0.4 A/W [9].

Figure 5:
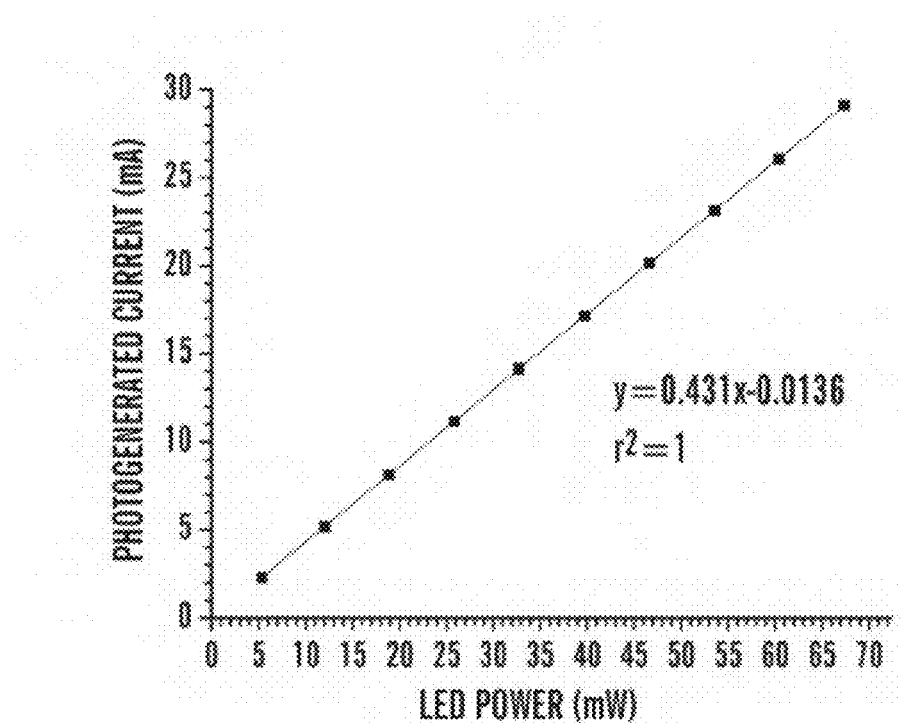
FIG. 5 depicts photogenerated current from a SBPSD of the current invention as a function of incident LED power, and portraying the device responsivity in A/W as the slope of the curve.

In order to determine the responsivity of the self-balancing position sensitive detectors, I-V curves were measured at various LED intensities controlled by the applied current as well as with no illumination. The photogenerated current was obtained by subtracting the measured dark current from the illuminated response. The light intensity was measured using calibrated photodiodes inside a Newport 1815-C Power Meter. The responsivity of the prototype detectors in this work was determined to be 0.43 A/W, as shown in FIG. 5, which compares favorably with commercially available photodiodes illuminated with the 623 nm wavelength LED used.

Fabrication Process Flow

In one embodiment, 6" (100) p-type silicon wafers with a resistivity of 80-130 ohm-cm, a thickness of 675 µm and 500 nm of oxide on the surface were used for the device fabrication. First, alignment marks were patterned onto the front of the substrate using standard contact photolithography processing. The alignment marks were etched through the $SiO_2$ into the silicon wafer itself, providing a permanent reference feature for future alignment.

Figure 6:
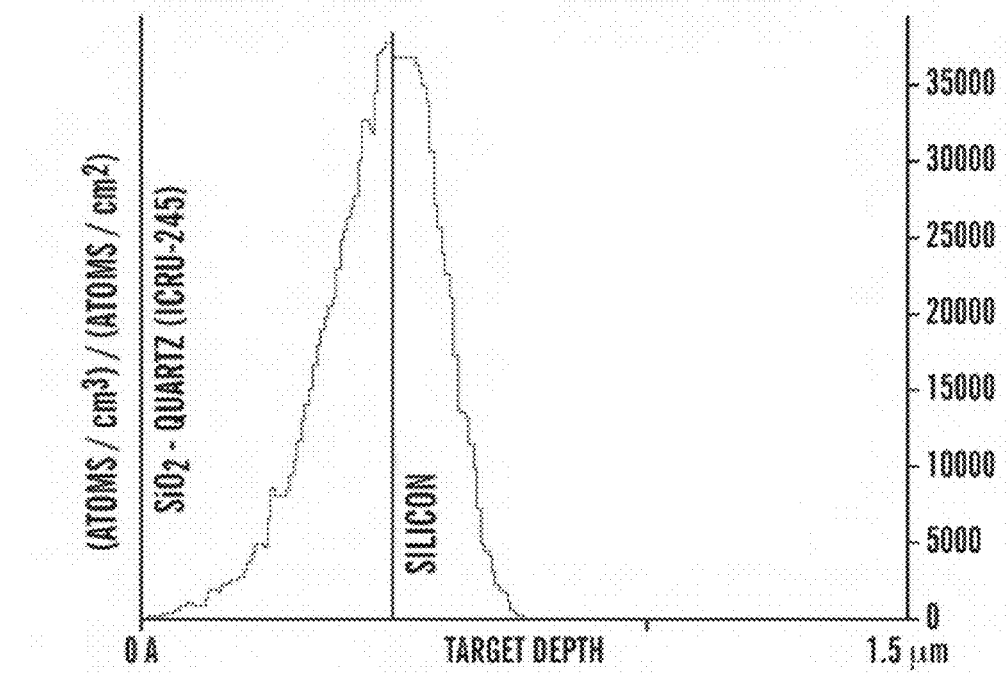
FIG. 6 depicts a simulation of phosphorous ion implantation through a surface oxide using SRIM software.

The main doped device regions were then defined onto the $SiO_2$ with standard contact photolithography processing, leaving only the desired doping area exposed. The parallel device regions were then doped with phosphorous through the oxide using ion implantation. The implant energy was 350 keV and the dose was $1.67 \times 10^{16}$ ions/cm$^2$, as shown in FIG. 6, simulated by SRIM (Stopping Range of Ions in Matter) software. After the implant, the photoresist mask was stripped, and the wafers were annealed in argon at 1000° C. for 1 minute using a rapid thermal anneal process to thermally activate dopants and fix damage in the crystal lattice Openings in the $SiO_2$ were patterned using contact photolithography and etched using buffered oxide etchant (Transene Company, Inc.) in order to allow direct contact to each of the doped silicon regions. The electrode metals, 200 Å of titanium followed by 1500 Å of gold, were then deposited onto the substrate, and subsequently patterned to form the electrical device contacts. Upon completion, the devices were sent for dicing.

Advantageously, no backside processing of the substrate is needed nor employed.

In order to analyze the influence that the width of the separation line between the doped areas has on device performance, devices were fabricated of 37 mm, 74 mm and 100 mm device length.

Results and Discussion

Coordinate characteristic of the position sensitive detector (PSD) is a plot of light spot position vs the voltage output for that light position. Measurements were performed by first centering a light spot to fit the entire device width and scanning it along the device. The response of each device to a moving light spot is illustrated by the plot of Voltage vs Position in FIG. 8, discussed hereinafter. These plots were recorded using a program created in LabVIEW, which used a Keithley source measure unit (SMU) to read the voltage and a programmable probe station to incrementally scan the length of the device using the light spot focused by a microscope. The light spot used fits the entire device width. However if the device was misaligned or the light spot didn't cover the entire device, this affected the resulting coordinate plot.

To investigate this effect, 37 mm long devices fabricated with a metal line connecting the contact pads 18, 20 of a first doped region 12 while bare silicon connected the contact pads of a second doped region 14, were used for testing (FIG. 7). Testing was performed by moving the light spot incrementally by an offset in the vertical direction by 0.2 mm from the center and the same measurement was performed. The light spot was further offset by 0.2 mm to the left for a total of 0.4 mm from the center light spot and a coordinate plot was measured (FIG. 8). The same measurement was then performed on the bottom portion of the device at 0.2 and 0.4 mm from the center. In FIG. 8, points E and F are positioned identically with reference to the light spot with the only difference being which region the 0 to 5 V bias was applied. Point E clearly demonstrates that application of a bias onto the metal line connected contact pads achieved a linear profile compared to the curved profile in point F where the bias was placed on the side with no metal line connecting the contacts. It was determined that positioning the light spot closer to the biased region led to a more linear voltage vs position response, and the output voltage was closer to the value applied to the biased line.

The parallel doped regions are photosensitive. Their resistance changes under illumination resulting in non-uniform potential distribution along the bias line. This may result in a non-symmetric coordinate characteristic. To compensate, an additional directly overlying and abutting metal line was added at the edge of each doped region connecting the contact pads of each respective region. As a result, the doped regions and metal lines work as two resistors connected in parallel. This addition avoids the influence of resistance changes and makes the coordinate characteristic symmetric.

I-V measurements were performed to understand changes in the coordinate characteristic due to variation in spot location. Measurements were performed using a light spot with a Gaussian profile which led to a non-symmetric volt-ampere characteristic for these devices with respect to the position of the light spot across the device. I-V curves were measured by sweeping from −2 to 2 V and recording the corresponding current. If the light spot does not illuminate part of both lines identically, the I-V curve changes in response. This effect was confirmed by measuring the 37 mm long SBPSD with 50 micron spacing between the doped lines by first placing the light spot such that it covered the whole device width and measuring the IV response.

The location of the light spot was changed similarly to FIG. 8, by moving the spot position by 0.2 and 0.4 mm in the Y and −Y direction and the I-V curves measured. In the resulting I-V curves (FIG. 9), the positive saturation current decreased for all measurements that were not in the center of the device. For the negative saturation current, a noticeable difference was observed; depending on which side of the device the light spot was moved, the current changed in response. When the light spot was offset towards the biased line, the saturation current was more negative (lower) than at the center light position. When the light spot was offset towards the floating line, the current was less negative (higher) than the center light position. This change in the I-V response led to a corresponding change in the coordinate characteristic for these devices. The performance measurements confirmed the importance of light positioning on the photosensitive surface of the device for accurate coordinate determination.

Investigations were performed to determine how the distance between doped regions would affect the slope of the I-V curve. 37 mm devices were fabricated with a distance of 50 μm and 75 μm between the doped regions. Various distances between the doped regions will result in different values in resistance between regions and changes in the slope of the transition part between saturation regions of I-V curves as can be seen in the inset in FIG. 10.

The distributed biased line is the doped silicon and its resistance can be changed by light illumination. The influence of resistance change due to photosensitivity on SBPSD coordinate response was studied. The coordinate characteristic of the device and its resistance along the biased line were measured to determine the effect of resistance change on the linearity in the coordinate plot. Two types of devices were used for this measurement. The devices that were used for this measurement are the dual metal line 100 mm length devices. The metal used for the contact pads is 1500 Å of Au on top of 500 Å of Ti. In one device the contact pads were covered with chemically resistant tape and the Au was etched leaving only Ti on the line connecting the device. The device with only Ti across the device had a maximum resistance of 26.8 kΩ near the side where 5V was applied compared to the device with Au—Ti yielding a max resistance of 163.7Ω.

A 0 to 5 volt bias was first applied across the Ti line. Using this bias a coordinate plot for voltage and resistance change vs position were measured; the resistance was calculated by Ohm's law. A significant resistance change (~70%) led to a non-linear non-symmetric coordinate plot (FIG. 11).

The 0 to 5 V bias was then applied to the Au—Ti line. Using this bias condition, a coordinate plot for voltage and resistance change vs position was measured. It was observed that having a low resistance led to a linear symmetric coordinate plot. The resistance was essentially constant across the device with an overall resistance change of 0.2%. The application of the bias to the device with the lower resistance led to a linear symmetric coordinate plot and a significantly lower resistance change as seen in FIG. 12.

A symmetric and linear coordinate plot is desirable for operation of the Self Balancing Position Sensitive Detector. The sensor's operation was tested using Microsoft Windows built-in game controller configuration software. This configuration software allows for the user to set a voltage value inside a defined range to a light spot position along a particular axis. In this case, the output voltage varies with the movement of the LED light source 32 mounted to a movable member 34, and is defined as movement on the x-axis. The operation of the sensor is demonstrated in FIG. 13.

The light pattern employed with the self-balancing position sensitive detector of the present invention may be derived directly, or indirectly, from any available light source. Advantageously, at least one of the light source and the light pattern is adapted to move together with, in association with, or in response to, a displaceable, rotatable, pivotable or otherwise movable member. The light may be monochromatic or polychromatic. The light producing the light pattern may be collimated or un-collimated, focused or unfocused, unidirectional or multidirectional, natural or artificial, continuous or discontinuous. Although visible light is currently preferred, the device of the present invention may be adapted to operate with light of other wavelengths. The light pattern may comprise a light spot of circular or other cross-sectional shape, multiple light spots, or distributed illumination.

The length, width, depth, shape, doping concentration, and/or separation of the doped regions of the self-balancing position sensitive detector may vary. Devices with larger region widths had higher measured potential at the final position and more photogenerated current, higher slope and better resolution. Preliminary 30 mm length devices exhibited device resolution of about 140 μV/μm. Devices of greater length, e.g., 74 mm and 100 mm, have also been developed and tested. All of these sensors are fabricated without any backside processing or contact and operate without requiring any circuitry for output signal processing, in order to obtain a readout of longitudinal position. The latter feature facilitates direct interface from the self-balancing position sensitive detector to a voltmeter, computer, or other measurement, display or utilization device while avoiding the added complexity and expense of external output signal processing electronics. Further, the fabrication and packaging cost is significantly lower than known lateral effect position sensitive detectors.

REFERENCES

[1] I. Edwards, "Using Photodetectors for Position Sensing," *Sensors Magazine*, pp. 26-32, 1998.
[2] A. Mlkynen and J. Kostamovaara, "Digital Optical Position-Sensitive Detector (PSD)," vol. 30, pp. 30-33.
[3] J. T. Wallmark, "A New Semiconductor Photocell Using Lateral Photoeffect," *Proc. IRE,* vol. 45, pp. 474-483, 1957.
[4] M. F. Chowdhury, P. A. Davies, and P. Lee, "CMOS 1D And 2D N-Well Tetra-Lateral Position Sensitive Detectors," in *ISCAS '98. Proceedings of the* 1998 *IEEE International Symposium on Circuits and Systems* (Cat. No. 98CH36187), vol. 6, pp. VI-606-VI-609.
[5] A. Mäkynen, T. Ruotsalainen, and J. Kostamovaara, "High accuracy CMOS position-sensitive photodetector (PSD)," *Electron. Lett.*, vol. 33, no. 2, p. 128, 1997.
[6] H. Andersson, "Position Sensitive Detectors—Device Technology and Applications in Spectroscopy Applications in Spectroscopy," Mid Sweden University, 2008.
[7] H. Spieler, "Introduction to Radiation Detectors and Electronics," 1998.
[8] V. Radeka and P. Rehak, "Charge Dividing Mechanism on Resistive Electrode in Position-Sensitive Detectors," *IEEE Trans. Nucl. Sci.*, vol. 26, no. 1, pp. 225-238, 1979.
[9] H. John, Wilson John, *Optoelectronics: An Introduction.* 1998.

The invention claimed is:

1. A self-balancing optical position sensitive detector, comprising a pair of spaced apart, parallel, longitudinally extending doped regions on a first surface on a front side of a substrate of opposite doping type with contact pads on the front side at respective ends of a first doped region of the pair, a voltage source applying a potential difference between the contact pads of the first doped region, and a contact pad of a second doped region of the pair on the front side providing an output signal representative of a longitudinal position of a center of gravity of an incident light pattern along the doped regions, without any contact on a backside of the substrate or external circuitry processing the output signal to obtain a readout of the longitudinal position.

2. The self-balancing optical position sensitive detector of claim 1, further comprising a resistive line directly overlying, abutting and in contact with at least a portion of the first doped region and interconnecting the contact pads of the first doped region.

3. The self-balancing optical position sensitive detector of claim 2, wherein the resistive line comprises one of a metal, or a doped area having a same doping type as the first doped region and a higher doping concentration than the first doped region.

4. The self-balancing optical position sensitive detector of claim 2, further comprising a conductive line directly overlying, abutting and in contact with at least a portion of the second doped region.

5. The self-balancing optical position sensitive detector of claim 1, in combination with a light source providing a light pattern incident on the doped regions.

6. The self-balancing optical position sensitive detector of claim 5, wherein at least one of the light source and the light pattern is adapted for movement together with, or in association with, or in response to, a moveable member.

7. The self-balancing optical position sensitive detector of claim 5, wherein the light pattern comprises a light spot, or multiple light spots or distributed illumination.

8. A method of determining the longitudinal position of a light pattern incident on the doped regions of the self-balancing optical position sensitive detector of claim 1, comprising: applying a potential difference between the contact pads of the first doped region, and measuring the potential at a contact pad of the second doped region, without further processing of the output signal provided from the contact pad of the second doped region, to obtain a readout of the longitudinal position.

9. A method of fabricating the self-balancing optical position sensitive detector of claim 1, comprising: employing semiconductor fabrication techniques with no backside processing of the substrate to produce the self-balancing optical position sensitive detector.

* * * * *